United States Patent
Scherer

[11] 4,008,945
[45] Feb. 22, 1977

[54] ULTRAVIOLET-TRANSMITTING WINDOW FOR A PROM

[75] Inventor: Jeremy D. Scherer, Dartmouth, Mass.

[73] Assignee: Isotronics, Inc., New Bedford, Mass.

[22] Filed: Apr. 17, 1975

[21] Appl. No.: 569,001

Related U.S. Application Data

[62] Division of Ser. No. 470,123, May 15, 1974, Pat. No. 3,924,246.

[52] U.S. Cl. .................................... 350/1; 65/59 B
[51] Int. Cl.² ........................................... G02B 5/20
[58] Field of Search ............... 65/59 R, 59 A, 59 B, 65/39; 350/1; 163/193, 196

[56] References Cited
UNITED STATES PATENTS

| | | | |
|---|---|---|---|
| 2,773,289 | 12/1956 | Martin et al. | 65/59 B |
| 3,035,372 | 5/1962 | Mayers | 65/59 R |
| 3,225,132 | 12/1965 | Baas et al. | 65/59 B |
| 3,347,651 | 10/1967 | Lueck | 65/39 |
| 3,356,466 | 12/1967 | Wildeboer et al. | 65/59 B |
| 3,582,300 | 6/1971 | Coombes et al. | 65/59 R |
| 3,598,556 | 8/1971 | Hunt | 65/59 B |

FOREIGN PATENTS OR APPLICATIONS

| | | |
|---|---|---|
| 821,772 | 10/1959 | United Kingdom |
| 956,341 | 4/1964 | United Kingdom |

*Primary Examiner*—David C. Nelms
*Attorney, Agent, or Firm*—Schuyler, Birch, Swindler, McKie & Beckett

[57] ABSTRACT

An ultraviolet-transmitting glass window assembly comprising a metallic mounting ring containing an ultraviolet-transmitting glass is made by placing a preformed ultraviolet-transmitting glass member in the center of the metallic ring which has a higher coefficient of thermal expansion than the glass, heating the resulting assembly to melt the glass whereby it completely fills the ring, and cooling the assembly whereby a compression seal is achieved due to the greater shrinkage of the metallic ring. This window assembly is sealed over the memory chip of a programmable read only memory package to provide for ultraviolet erasure of the program information stored in the memory device.

11 Claims, 4 Drawing Figures

ULTRAVIOLET-TRANSMITTING WINDOW FOR A PROM

RELATED APPLICATIONS

This is a division of Application Ser. No. 470,123, filed May 15, 1974 now U.S. Pat. No. 3,924,246.

BACKGROUND OF THE INVENTION

1. Field of the Invention

This invention relates to an ultraviolet-transmitting glass window assembly, and the method for its manufacture; and further relates programmable read only memory device which is sealed with an ultraviolet-transmitting glass window assembly and the method of making this device.

2. Description of the Prior Art

The "read only memory device" (ROM) has found wide acceptance in the electronic data processing industry. The programmable variation of this device (PROM) has also proved useful in many applications. It has recently been discovered that the program information stored in a PROM can be erased by exposing the memory chip to ultraviolet light. This erasure does not harm the chip and the erased PROM can be reprogrammed in the same manner as it was programmed originally. In order to facilitate the erasing procedure, industry has turned to a PROM package with a ultraviolet-transmitting cover. The ultraviolet-transmitting covers commonly used in the art are made from quartz or artifical quartz (fused silica). The quartz PROM covers of the prior art have a number of drawbacks. Because quartz has such a high melting point, the forming of PROM covers from this relatively cheap raw material is very expensive. The quartz covers also require time consuming and expensive finishing steps such as mechanical machining and lapping them into shape. In addition, there does not appear to be any way to make a reliable hermetic seal with quartz at a reasonable cost.

Quartz covers are currently sealed onto the PROM package in two ways. The first method is to affix the quartz cover to the package with epoxy. This method has proven unsatisfactory for most applications since moisture can migrate through the epoxy seal and damage the sensitive memory chip. Additionally, since epoxy will not generally provide good adherence between smooth surfaces, it is often necessary to abraid or etch the edge of the quartz. This abrasion creates additional channels for the transmission of moisture through the epoxy seal. The second method now employed to seal quartz covers to PROM packages is to metalize a ring around the edge of the quartz and then solder the metalized surface to the package. One disadvantage to this method is that metalizing the quartz is a very expensive procedure. Metalization is also a sophisticated and tricky process which may produce defects in the metalized seal.

SUMMARY OF THE INVENTION

The present invention provides an improved ultraviolet-transmitting window assembly suitable for use with a PROM which has none of the drawbacks of the prior art covers.

It is an object of the invention to provide a window assembly which is transparent to ultraviolet light and easy and inexpensive to manufacture.

It is a further object of the invention to provide a window assembly which may be hermetically sealed to a PROM package in a simple and reliable manner.

Generally described, the invention provides an ultraviolet-transmitting window assembly which comprises a metallic mounting member with an aperture therethrough, and an ultraviolet-transmitting glass member sealed within said aperture, said metallic member having a higher coefficient of thermal expansion than said glass member, whereby the glass-to-metal seal is effected by compression. The invention also provides a method of making this window assembly which comprises forming a metallic mounting member with an aperture therethrough, placing a preformed ultraviolet-transmitting glass member within said aperture, said metallic member having a higher rate of thermal expansion than said glass member, heating the resulting assembly whereby the glass member melts and fills the aperture of the metallic member, and cooling the assembly whereby said metallic mounting member shrinks upon said glass member to form a compression seal. The invention also provides a PROM with the above described window assembly sealed over the memory chip of the package, and a method of making this PROM which comprises forming the window assembly as previously described and sealing it to the package.

The invention will be better understood from a consideration of the detailed description of the preferred embodiment given in connection with the following drawings.

DESCRIPTION OF THE PREFERRED EMBODIMENT

Figure 1:
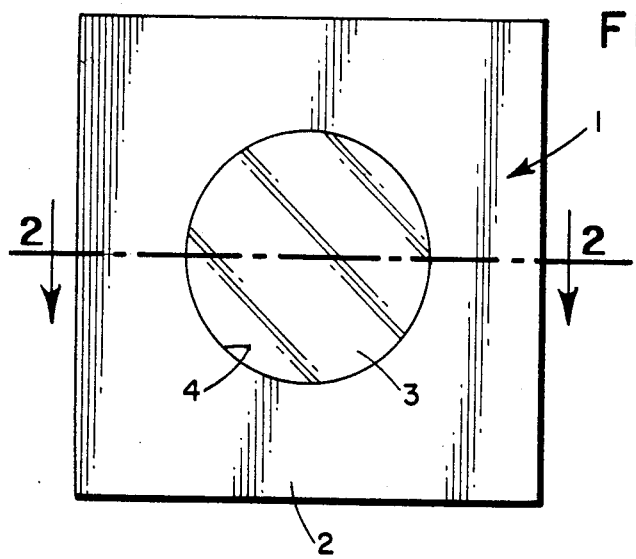
FIG. 1 represents a plan view of one embodiment of the ultraviolet-transmitting window assembly of the present invention.
Figure 2:
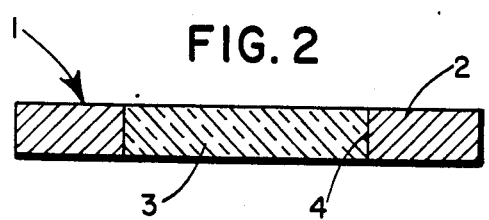
FIG. 2 represents a sectional view of the same assembly taken along line 2—2 of FIG. 1.

Reference is now made to the window assembly of the present invention as shown in FIG. 1. This window assembly 1 consists of a metallic mounting member 2 and ultraviolet-transmitting glass member 3. The glass member 3 can be any glass which will pass ultraviolet light, i.e., light in the frequency of 2537 angstroms. In order to effect PROM erasure in a practical length of time and with normal dose levels, the glass must pass a reasonable amount of the ultraviolet light. For most applications the glass should preferably pass about 60% or more of the ultraviolet light. Representative of such materials are the iron-free borosilicate glasses. These borosilicate glasses generally have a low coefficient of thermal expansion, normally in the range of 37 to 39 × $10^{-7}$ in/in/° C. The metallic mounting member 2 can be any metal which has a higher coefficient of thermal expansion than the ultraviolet-transmitting glass member employed. The preferred metals include Kovar, a trade name for an alloy consisting of 29% nickel, 17% cobalt and the remainder iron; and cold rolled steel. The coefficient of thermal expansion of Kovar is approximately 55 × $10^{-7}$ in/in/° C and that of cold rolled steel is $140 \times 10^{-7}$ in/in/° C. Kovar is the most preferred since it matches the expansion of most package materials, e.g., alumina. Cold rolled steel has the advantage of reduced cost. Both the metallic mounting member and the glass member should have a relatively flat cross section. The window assembly may be formed in any suitable shape. Contemplated are, for example, a round glass disc in a square, rectangular, or circular shaped mounting member with a round aperture therethrough. Both the shape of the glass disc and the mounting member may be varied to fit the particular application. The preferred configuration, as shown in FIG. 1, is with a square shaped mounting member, since most microcircuit packages are in this form. The overall dimensions of the window assembly will vary according to the PROM design.

An important aspect of the window assembly of the present invention is the glass-to-metal seal 4. The glass-to-metal seals of the prior art fall into two groups - matched seals and compression seals. The matched seal is made by selecting a glass and metal with about the same coefficient of thermal expansion. A compression seal is formed when the metal has a higher coefficient of thermal expansion than the glass and therefore shrinks in on the glass upon cooling. The seal of the present invention is of the latter type due to the differences in thermal expansion coefficients of the materials specified.

Unlike the seal of the present invention, prior art borosilicate glass-to-metal seals have been of the matched type. For example, it is known to make daylight-transmitting window assemblies from borosilicate glass for use in photocell applications. The glasses used in this type of window have a coefficient of thermal expansion in the range of 53 to $57 \times 10^{-7}$ in/in/° C, and there are a number of common metallic materials which can match this range. These highly thermal expansive borosilicate glasses do not pass ultraviolet light. The borosilicate glasses which do not pass ultraviolet light, as indicated above, have a coefficient of thermal expansion in the range of 37 to $39 \times 10^{-7}$ in/in/° C. There are no readily available metals or alloys which can match this expansion rate. Tungsten is the only metal that comes close and it is too expensive to be practical.

The prior art also discloses compression seals for use in some photocell applications. These compression seals, however, are made from potash, soda, lime or lead containing glasses, and none of these pass ultraviolet light.

Contrary to the teachings in the art, I have discovered that excellent compression seals can be made using low thermally expansive ultraviolet-transmitting borosilicate glasses and metals possessing a wide range of higher thermal expansion values. Mayer U.S. Pat. No. 3,035,372 teaches that there must be substantial differences in expansion in order to achieve a good hermetic seal. In spite of this I have found that Kovar (expansion $55 \times 10^{-7}$ in/in/° C forms good hermetic compression seals with ultraviolet-transmitting borosilicate glasses (expansion $37-39 \times 10^{-7}$ in/in/° C). By the same token, steel (expansion — 140 in/in/° C) is not normally used with borosilicate glasses for making compression seals. Dalton U.S. Pat. No. 2,770,923 teaches that such a large mismatch would produce too large a force and harm the seal. The seals of this invention, however, have extreme compression and they do not crack.

The ultraviolet-transmitting window assembly 1 can be made much more easily than the quartz covers the prior art since the glasses employed have a much lower melting point. In the preferred embodiment, the ultraviolet-transmitting glass batch materials are melted in a conventional crucible furnace and drawn into a rod. The rod is then centerless ground to a diameter just slightly smaller than the aperture in the metallic mounting member. Next the rod is sliced into discs which are just slightly thicker than the metalic member. The cutting operation leaves the surfaces of the disc unclear.

This disc, also referred to as a window preform, is placed within the aperture of the metallic mounting member and the resulting assembly is passed through a furnace. The furnace temperature is maintained substantially above the melting point of the glass so that the disc melts and fills the aperture of the mounting member. Some wetting between the glass and the metal will occur at the edge. As the assembly cools, the metallic mounting member will shrink upon the glass and form a compression seal due to the difference in thermal expansion rates.

Next the sealed window assembly is placed in a special fixture so that nothing touches the glass and rapidly passed through a moderate heat furnace to fire polish the glass. Temperatures of a few degrees above the melting point of the glass are generally employed for this operation. The glass is normally exposed to the above temperature for about a minute. This of course will depend on the mass of the part, and the heating capacity of the furnace. The resulting window assembly is relatively flat, free from flaws and quite clear.

Figure 4:
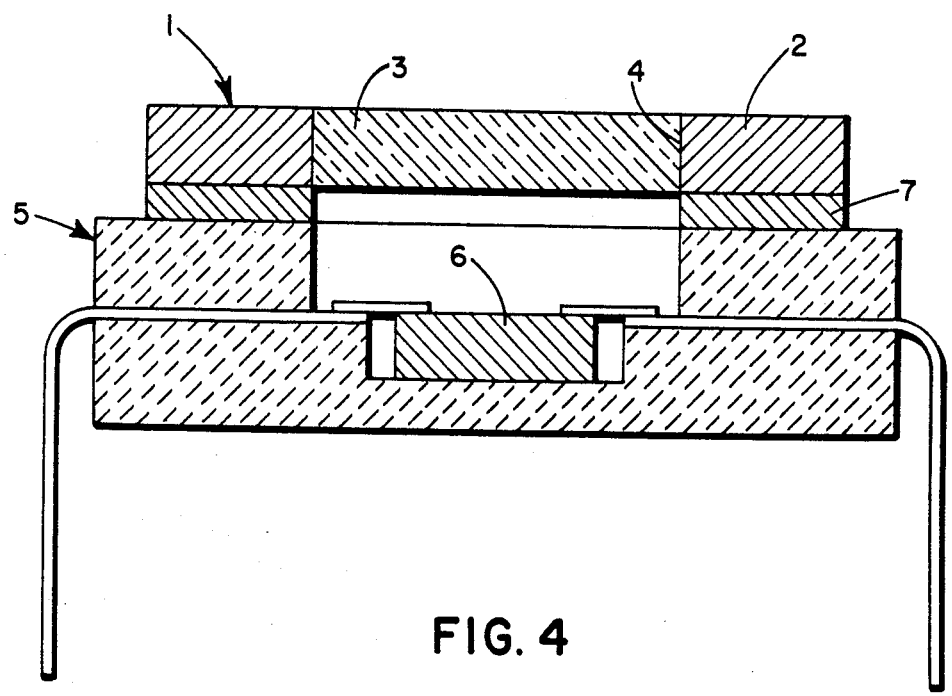
FIG. 4 represents an elevational view of the PROM of the invention with the window assembly sealed in place over the memory chip.

Reference is now made to FIG. 4, which represents the PROM of the present invention covered with the above described window assembly. The PROM 5 has a cavity in its upper surface which contains the memory chip 6. Around this cavity is a lid mounting ring 7. Sealed to this ring is the ultraviolet-transmitting window assembly 1 described in detail above.

The window assembly can be sealed to the PROM mounting ring in a number of ways. Where the chip is moisture sensitive and a reliable hermetic seal is desired the window assembly can be soldered to the ring. In this embodiment the assembly is first plated with a suitable metal in, for example, a plating barrel. This is quite inexpensive since many thousands can be plated simultaneously. After the parts are plated they can be soldered in place using tin/lead solder, tin/silver solder, gold/tin eutectic, gold/tin/germanium eutectic, or any other type of solder normally employed in semiconductor manufacture. The soldering can be accomplished in a conveyorized furnace, in batches or even individually. With the proper type of package the window assembly of this invention could even be welded in place.

The window assembly of the present invention may also be employed in devices where hermeticity is not required. In this type of application, environmental protection can be obtained by affixing the window assembly to the package with epoxy.

The completed PROM assembly may be easily erased and electrically reprogrammed. For example, an integrated dose (i.e., UV intensity × exposure) of 6W-sec/cm$^2$ of light at a wavelength of 2537 A will completely erase the memory in about 10 to 20 minutes when the chip is about one inch from the UV source. Any suitable source of UV light may be used, such as ultraviolet lamps manufactured by the Ultra Violet Products, Inc. (San Gabriel, Calif.).

Figure 3:
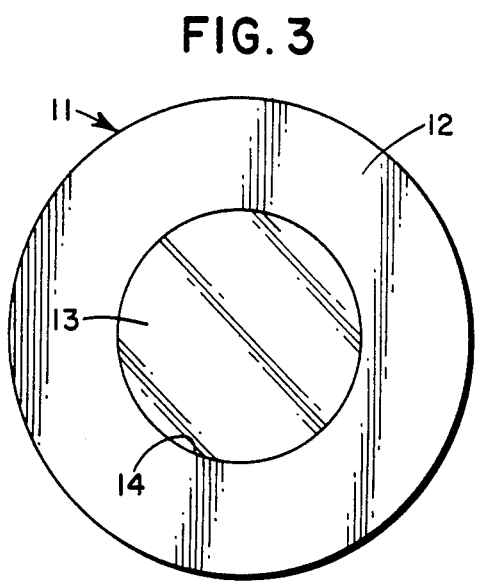
FIG. 3 represents a plan view of an alternate embodiment of the window assembly of the present invention.

FIG. 3 represents an alternate embodiment of the window assembly 1 of the invention having a circular shaped metallic mounting member 12. The elements of this assembly 12, 13, and 14 correspond respectively to elements 2, 3 and 4 of FIG. 1.

While certain specific embodiments of the invention have been described with particularity it is recognized that various modifications thereof will occur to those skilled in the art. Therefore, the scope of the invention is to be limited solely by the scope of the claims appended hereto.

I claim:

1. An ultraviolet-transmitting window assembly comprising a metallic mounting member with an aperture therethrough, and an ultraviolet-transmitting borosilicate glass member positioned within said aperture, said metallic member having a higher coefficient of thermal expansion than said glass member and wherein said glass member is held within the aperture of said metallic member by a fused glass-to-metal hermetic compression seal.

2. The ultraviolet-transmitting window assembly of claim 1 wherein said metallic mounting member is square.

3. The ultraviolet-transmitting window assembly of claim 1 wherein said metallic mounting member is rectangular.

4. The ultraviolet-transmitting window assembly of claim 1 wherein said metallic mounting member is circular.

5. The ultraviolet-transmitting window assembly of claim 1 wherein said aperture is circular.

6. The ultraviolet-transmitting window assembly of claim 1 wherein said aperture is centrally disposed in said metallic mounting member.

7. The ultraviolet-transmitting window assembly of claim 1 wherein said borosilicate glass member has a thermal expansion rate from about 37 to about 39 $\times$ $10^{-7}$ in/in/° C.

8. A process for producing an ultraviolet-transmitting window assembly which comprises forming a metallic mounting member with an aperture therethrough, placing a preformed ultraviolet-transmitting borosilicate glass member in said aperture, said metallic member having a higher coefficient of thermal expansion than said glass member, heating the resulting assembly whereby said glass member melts and fills said aperture, and cooling the assembly whereby said metallic mounting member shrinks upon said glass member to form a fused glass-to-metal hermetic compression seal.

9. The process of claim 8 including the additional step of fire polishing the cooled assembly.

10. The process of claim 8 wherein said preformed glass member is made by melting an ultraviolet-transmitting glass, drawing the glass into a rod, and slicing the rod into discs.

11. The process of claim 8 wherein said borosilicate glass member has a thermal expansion rate of from about 37 to about 39 $\times$ $10^{-7}$ in/in/° C.

* * * * *